United States Patent [19]
Kohno et al.

[11] Patent Number: 5,633,611
[45] Date of Patent: May 27, 1997

[54] COMPLEMENTARY CURRENT SOURCE CIRCUIT

[75] Inventors: Hiroyuki Kohno; Takahiro Miki, both of Itami, Japan

[73] Assignee: Mitsubishi Denki Kabushiki Kaisha, Tokyo, Japan

[21] Appl. No.: 557,713

[22] Filed: Nov. 13, 1995

[30] Foreign Application Priority Data

Jun. 6, 1995 [JP] Japan .................................. 7-139493

[51] Int. Cl.$^6$ ................................................ H03K 17/687
[52] U.S. Cl. ............................ 327/543; 327/108; 327/374; 326/17
[58] Field of Search .......................... 327/538, 541, 327/543, 546, 545, 427, 434, 437, 108, 63, 65, 90, 374, 375, 376, 377; 326/81, 83, 86, 17, 34

[56] References Cited

U.S. PATENT DOCUMENTS

| 4,327,333 | 4/1982 | Wilcox | 330/278 |
|---|---|---|---|
| 4,721,866 | 1/1988 | Chi et al. | 326/86 |
| 4,939,390 | 7/1990 | Coe | 326/115 |
| 4,977,378 | 12/1990 | Tero | 330/258 |
| 5,179,358 | 1/1993 | Martin | 331/1 A |
| 5,396,133 | 3/1995 | Zhang | 327/434 |
| 5,430,337 | 7/1995 | Castello et al. | 327/65 |
| 5,489,868 | 2/1996 | Gilbert | 327/65 |

FOREIGN PATENT DOCUMENTS

| 1-231432 | 9/1989 | Japan . |
|---|---|---|
| 1-289319 | 11/1989 | Japan . |
| 4-54020 | 2/1992 | Japan . |
| 4-219025 | 8/1992 | Japan . |
| 4-310020 | 11/1992 | Japan . |

OTHER PUBLICATIONS

1990 Symposium on VLSI Circuits Digest of Technical Papers, pp. 55–56, Jun. 1990, N. Kumazawa, et. al., "AN 8 Bit 150 MHz CMOS D/A Converter With 2 Vp–p Wide Range Output".

IEEE Journal of Solid–State Circuits, vol. 26, No. 7, pp. 1073–1077, Jul. 1991, Jean Michel Fournier, et. al., "A 130–MHz 8–b CMOS Video DAC For HDTV Applications".

Primary Examiner—Timothy P. Callahan
Assistant Examiner—My-Trang Nu Ton
Attorney, Agent, or Firm—Oblon, Spivak, McClelland, Maier & Neustadt, P.C.

[57] ABSTRACT

Driving circuits (6) output driving signals to drive switching transistors (Q 15, Q16). A potential as the high level of the driving signal can be set lower than a power supply voltage ($V_{DD}$) by connecting the sources of transistors (Q18, Q20) to a node (X). This configuration prevents an overshoot at a switching time and allows an improvement in a settling time. Therefore, a complementary current source circuit for a high-speed D/A converter can be provided.

6 Claims, 14 Drawing Sheets

INPUT SIGNAL

DRIVING SIGNAL

OUTPUT SIGNAL

INPUT SIGNAL

DRIVING SIGNAL

OUTPUT SIGNAL

INPUT SIGNAL

DRIVING SIGNAL

OUTPUT SIGNAL

INPUT SIGNAL

DRIVING SIGNAL

OUTPUT SIGNAL

INPUT SIGNAL

DRIVING SIGNAL

OUTPUT SIGNAL

COMPLEMENTARY CURRENT SOURCE CIRCUIT

BACKGROUND OF THE INVENTION

1. Field of the Invention

The present invention relates to a complementary current source circuit used in a Digital-to-Analog converter (hereinafter referred to as "D/A converter"), and more particularly to circuit means to provide a D/A converter's output with little overshoot.

2. Description of the Background Art

A D/A converter for converting a digital signal to an analog signal is an essential electronic device in the art of electronic apparatus for public welfare, such as apparatus for measurement, control, communication and image. For example, a circuit configuration of the D/A converter is shown in the following documents: (1) Naoki Kumazawa et al., "An 8 bit 150 MHz CMOS D/A converter with 2 Vp-p wide range output," Symposium on VLSI Circuits Digest of Technical Papers, pp. 55–56, June, 1990 and (2) Jean Michel Fournier and Patrice Senn, "A 130 MHz 8-b CMOS Video DAC for HDTV Applications," IEEE Journal of Solid-State Circuits, Vol. 26, No. 7, July, 1991. As is seen from these documents, the D/A converter comprises a plurality of complementary current source circuits, the number of which is determined as a function of the number of bits of the input signal (e.g., $2^N$ complementary current source circuits are provided when the input signal of N bits is processed), and operates some of the complementary current source circuits in response to the input signal. When currents from the operating complementary current source circuits are collected and then flow into a resistance element of desired resistance value, an analog voltage in accordance with a digital signal can be obtained. Therefore, the complementary current source circuit is a key device in the D/A converter.

The circuit configuration of a complementary current source circuit used in a D/A converter in the prior art will be discussed, referring to its model. FIG. 14 is a circuit diagram of a complementary current source circuit having a main current source which consists of PMOS transistors, as shown in the above documents (1) and (2), while FIG. 15 is a circuit diagram of a complementary current source circuit having a main current source which consists of NMOS transistors. The complementary current source circuit discussed herein essentially consists of a main current source and driving circuits for driving switching transistors of the main current source. A CMOS inverter circuit as shown in these figures is the simplest driving circuit.

The complementary current source circuit of FIG. 14 essentially consists of a main source current 1 and driving circuits 2 and the complementary current source circuit of FIG. 15 essentially consists of a main current source 3 and driving circuits 4. In the discussion below, the reference characters and numerals represent the elements of FIG. 14 and those inside parentheses represent the elements of FIG. 15. The values of input signals $\overline{S}$ and S are generated and then applied to the gates of respective transistors in the driving circuits 2 (4). Transistors Q1 (Q8) and Q2 (Q9) in the main current source 1 (3) are switching transistors which have source terminals connected in common (hereinafter referred to as "common source"). The common source is connected to a transistor Q3 (Q10) for constant current source. A bias voltage is applied to the gate terminal of the transistor Q3 (Q10) so that the transistor Q3 (Q10) may always operate in a saturation region to pass a constant drain current. Complementary driving signals $\overline{VG}$ and VG are applied to the gate terminals of the transistors Q1 (Q8) and Q2 (Q9), respectively, through the driving circuits 2 (4) to alternately turn on and turn off the transistors Q1 (Q8) and Q2 (Q9). Thus, in response to the driving signal $\overline{VG}$ or VG, a switching is done by passing the drain current of the transistor Q3 (Q10) to an output terminal $\overline{I_{out}}$ or $I_{out}$. These figures also show resistance loads RL provided outside the D/A converter and floating capacitances Cx and Co which exist at an internal node and an external node, respectively. For example, in the D/A converter provided with $2^N$ complementary current source circuits, an analog voltage $V_{out}$ in accordance with a digital signal can be obtained by collecting the currents from the complementary current source circuit which operates in response to the input signals $\overline{S}$ and S and applying the collected current to the resistance element RL of desired resistance value.

Having such a configuration as above, the complementary current source circuits used in the prior-art D/A converter has a problem as discussed below.

Referring to charts of FIGS. 16A to 16C showing a relation between input signals and output signals, an operation of the prior-art complementary current source circuit of PMOS configuration of FIG. 14 will be discussed. When the input signals $\overline{S}$ and S shown in FIG. 16A are inputted to the driving circuits 2, the driving signals $\overline{VG}$ and VG shown in FIG. 16B are generated. A voltage $V_X$ at the internal node X in the main current source once slightly fluctuates from a stationary value $V_{X0}$ in a positive direction at a switching time and then converges on a voltage $V_{X0}$ again, as shown in FIG. 16B. With this fluctuation of the voltage $V_X$ at the internal node X, the floating capacitance Cx at the internal node X once becomes charged and then discharged. In consequence, a surplus current is generated to thereby increase the output current (e.g., $I_{out}$) and the output voltage (e.g., $V_{out}$) developed across the resistance load RL fluctuates at a large slew rate, leading to an overshoot as shown in FIG. 16C. Therefore, it is disadvantageously impossible to achieve a short settling time.

Referring to charts of FIGS. 17A to 17C showing a relation between input signals and output signals, an operation of the prior-art complementary current source circuit of NMOS configuration of FIG. 15 will be discussed. In this case, a voltage $V_X$ at the internal node X in the main current source once slightly fluctuates from the stationary value $V_{X0}$ in a negative direction at a switching time and then converges on a voltage $V_{X0}$ again, as shown in FIG. 17B. With this fluctuation of the voltage $V_X$ at the internal node X, the floating capacitance Cx at the internal node once becomes charged and then discharged. In consequence, a surplus current is generated and the output voltage fluctuates at a large slew rate, leading to an overshoot as shown in FIG. 17C. Therefore, it is disadvantageously impossible to achieve a short settling time.

Since the switching transistors Q1 (Q8) and Q2 (Q9) in the complementary current source circuits of FIGS. 14 and 15 are simultaneously turned on or turned off, in particular, there arises a large fluctuation of the voltage $V_X$ at the internal node X and a great overshoot.

The settling time mentioned above refers to a time period until a stable analog signal is obtained in the D/A converter. A long settling time in the D/A converter leads to a delay of a processing for D/A conversion and accordingly it becomes impossible to keep up with an increasing advancement of the technique for speeding up the processing.

SUMMARY OF THE INVENTION

According to the present invention, a complementary current source circuit comprises a current source including at least one first transistor of a first conductivity type, having a first current electrode connected to a first power supply, a second current electrode and a gate to which a constant bias voltage is applied, a first switching transistor having a first current electrode connected to the second current electrode of the first transistor and a second current electrode connected to a first current output terminal, controlled by a first driving signal which is generated in accordance with a first digital signal, and a second switching transistor having a first current electrode connected to the second current electrode of the first transistor and a second current electrode connected to a second current output terminal, controlled by a second driving signal which is generated in accordance with a second digital signal; a first driving circuit for generating the first driving signal to drive the first switching transistor; and a second driving circuit for generating the second driving signal to drive the second switching transistor. In the complementary current source circuit, a first potential as the high level of the first driving signal is lower than a potential of the first power supply if the first conductivity type is P type, and a second potential as the low level of the first driving signal is higher than a ground potential if the first conductivity type is N type.

Preferably, the first driving circuit includes a first inverter circuit and the second driving circuit includes a second inverter circuit. The first inverter circuit comprises a second transistor of the first conductivity type, having a source connected to the second current electrode of the first transistor, and the second inverter circuit comprises a third transistor of the first conductivity type, having a source connected to the second current electrode of the first transistor.

Preferably, the complementary current source circuit of the present invention further comprises a voltage generator circuit including a second transistor of the first conductivity type of the same characteristics as the first transistor, having a first current electrode connected to the first power supply, a second current electrode and a gate to which the constant bias voltage is applied, and a third transistor of the first conductivity type, having a first current electrode connected to the second current electrode of the second transistor, a second current electrode connected to a second power supply and a gate connected to the second power supply so that the third transistor may be always conducted. The first driving circuit includes a first inverter circuit and the second driving circuit includes a second inverter circuit. The first inverter circuit comprises a fourth transistor of the first conductivity type, having a source connected to the second current electrode of the second transistor, and the second inverter circuit comprises a fifth transistor of the first conductivity type, having a source connected to the second current electrode of the second transistor, a drain for outputting the second driving signal and a gate.

In the complementary current source circuit of the present invention, since the first driving signal has the first potential as the high level set lower than the potential of the first power supply or the second potential as the low level set higher than the ground potential depending on the characteristic of the first conductivity type, the cross point of the first driving signal and the second driving signal outputted from the first and second driving circuits, respectively, is lower (when PMOS transistors are used) or higher (when NMOS transistors are used) as compared with the prior art, and therefore the first and second switching transistors are not simultaneously turned on and off.

Thus, in the complementary current source circuit of the present invention, since the first and second switching transistors are not simultaneously turned on and turned off, there arises a smaller fluctuation of the internal node voltage as compared with the prior art, leading to no overshoot of the output voltage and a short settling time. As the result, the complementary current source circuit for a high-speed D/A converter can be provided.

Moreover, without providing additional means for the source terminals of the second transistors of the first conductivity in the inverter circuits of the first and second driving circuits, it is possible to set the voltage at the source terminals lower than the power supply potential or lower than the ground potential by simple change of a connection of the transistors in the prior-art complementary current source circuit.

Furthermore, providing the voltage generator circuit makes it possible to prevent the current leakage from the current source to the inverters of the first and second driving circuits, thus avoiding the possibility of variation in the values of the output signals.

An object of the present invention is to provide a complementary current source circuit used for a high-speed D/A converter, which has a configuration such as to prevent the overshoot at the switching time and improve the settling time.

These and other objects, features, aspects and advantages of the present invention will become more apparent from the following detailed description of the present invention when taken in conjunction with the accompanying drawings.

DESCRIPTION OF THE PREFERRED EMBODIMENTS

<The First Preferred Embodiment>

Figure 1:
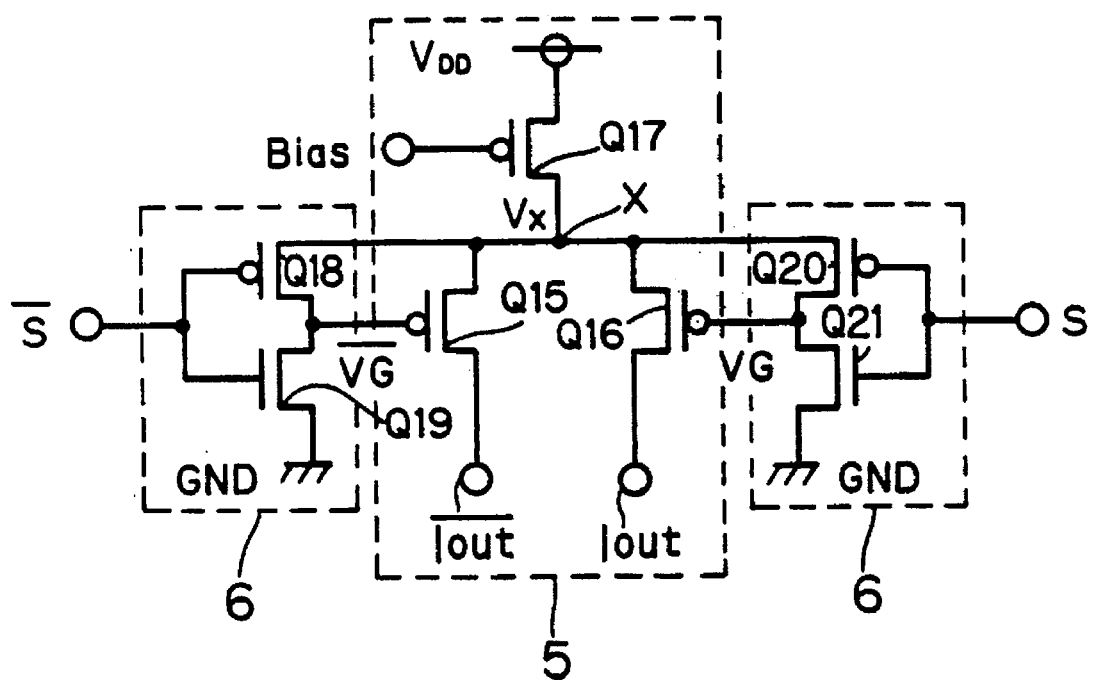
FIG. 1 is a circuit diagram of a complementary current source circuit used in a D/A converter, which has a main current source 5 consisting of PMOS transistors, in accordance with a first preferred embodiment of the present invention.

Now, referring to FIG. 1, the first preferred embodiment of the present invention will be discussed. FIG. 1 is a circuit diagram of a complementary current source circuit used in a D/A converter, having a main current source which consists of PMOS transistors. In a main current source 5, a bias voltage is applied to a transistor Q17 so that the transistor Q17 may always operate in a saturation region to pass a constant drain current. Complementary driving signals $\overline{VG}$ and VG outputted from driving circuits 6 are applied to the gate terminals of transistor Q15 and Q16, respectively, to alternately turn on or turn off the transistors Q15 and Q16. In response to the driving signal $\overline{VG}$ or VG, a switching is done by passing the drain current of the transistor Q17 to an output terminal $\overline{I_{out}}$ or $I_{out}$. The driving circuits 6 receive input signals $\overline{S}$ and S in accordance with a digital signal and generate driving signals $\overline{VG}$ and VG to be outputted to the main current source 5. In FIG. 1, the external resistance load RL and floating capacitances Cx and Co, shown in association with the prior art, are omitted.

FIG. 1 shows the same number of elements constituting the complementary current source circuit as used in the discussion of the prior art. An operation of the main current source 5 is also the same as that of the prior art. The important point of the present invention lies in a connection between the main current source 5 and the driving circuits 6 for driving the switching transistors Q15 and Q16 in the main current source 5, as is clear from FIG. 1. Specifically, while the source terminals of the PMOS transistors Q4 and Q6 are connected to the power supply lines $V_{DD}$ in the prior-art CMOS inverters, the source terminals of the PMOS transistors Q18 and Q20 are connected to an internal node X in the main current source 5 of the first preferred embodiment.

Figure 2A:
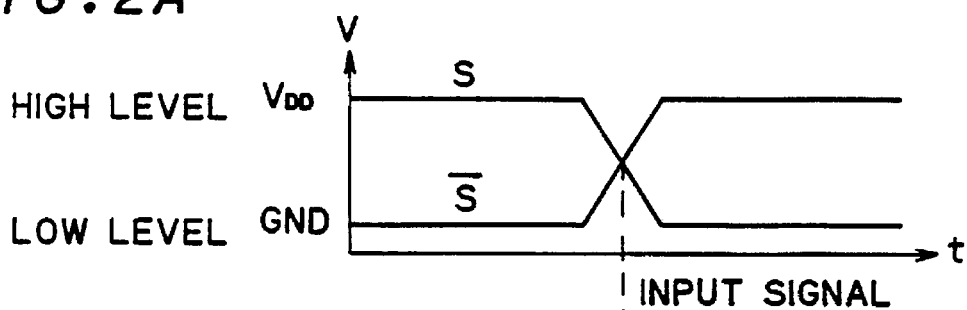
FIGS. 2A to 2C are charts showing signal waveforms in prime parts of the complementary current source circuit of FIG. 1.

Now, referring to signal waveforms shown in FIG. 2, an operation of the complementary current source circuit of FIG. 1 will be discussed. FIGS. 2A to 2C are charts showing signal waveforms in prime parts of the complementary current source circuit of FIG. 1. As can be seen from FIG. 2A, waveforms of the input signals $\overline{S}$ and S inputted to the driving circuits 6 are the same as those of the prior art. The values of the input signals $\overline{S}$ and S are generally determined in accordance with the digital signal inputted into the D/A converter, and it is assumed in FIG. 2A that a signal value as the high level and a signal value as the low level are alternately generated.

As to the driving signals $\overline{VG}$ and VG, a voltage as the high level is equivalent to the internal node voltage $V_X$ which is lower than the power supply voltage $V_{DD}$ since the source terminals of the transistors Q18 and Q20 are connected to the internal node X, while the source terminals of the transistors Q4 and Q6 are connected to the power supply line in the prior art. FIG. 2B shows waveforms of the driving signals $\overline{VG}$ and VG. Respective behaviors of the transistors in the main current source 5 are logically as follows: It is needed that the transistor Q17 should be in a saturation region and the transistor Q16 should be biased to operate in the saturation region when it is in an ON state. Specifically, the drain voltage $V_X$ of the transistor Q17 must be set sufficiently low so that the transistor Q17 may operate in the saturation region. The drain voltage $V_X$ depends on a gate voltage $V_G$ which is applied to turn on the transistor Q16. Therefore, assuming that reference characters $V_{sat}16$, $V_{sat}17$ and $V_{th}16$ represent a saturation voltage of the transistor Q16, a saturation voltage of the transistor Q17 and a threshold value of the transistor Q16 respectively, from the general expression which holds at a saturation boundary point "$V_{GS}-V_{Th}=V_{DS}$", the equation "$(V_G-V_X)-V_{th}=V_{sat}16$" holds with respect to the transistor Q16, leading to the equation "$V_X=V_G-V_{sat}16-V_{th}16$". Since the drain voltage $V_X$ of the transistor Q17 must be set sufficiently lower than "$V_{DD}+V_{sat}17$" so that the transistor Q17 may operate in the saturation region, it should satisfy "$V_X=V_G-V_{sat}16-V_{th}16<V_{DD}+V_{sat}17$". For example, assuming that the saturation voltages $V_{sat}16$ and $V_{sat}17$ are each −0.8 V, when the threshold value $V_{th}16$ is about −1.3 V under a body effect, the voltage $V_X$ is about 2.1 V where the gate voltage $V_G=0$.

Figure 2B:
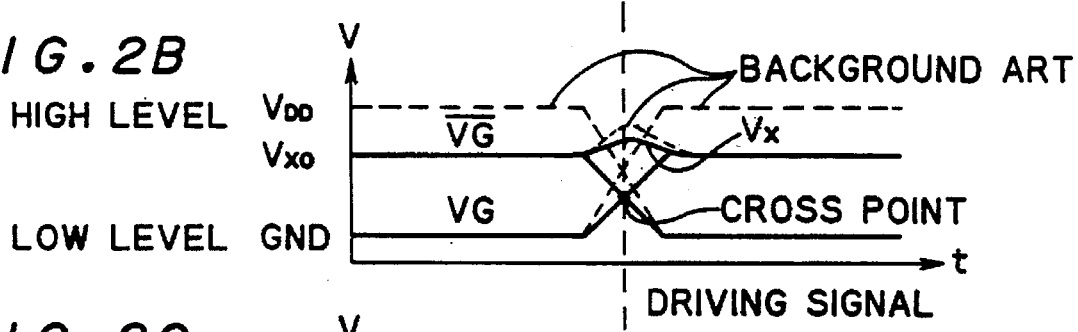
Figure 2C:
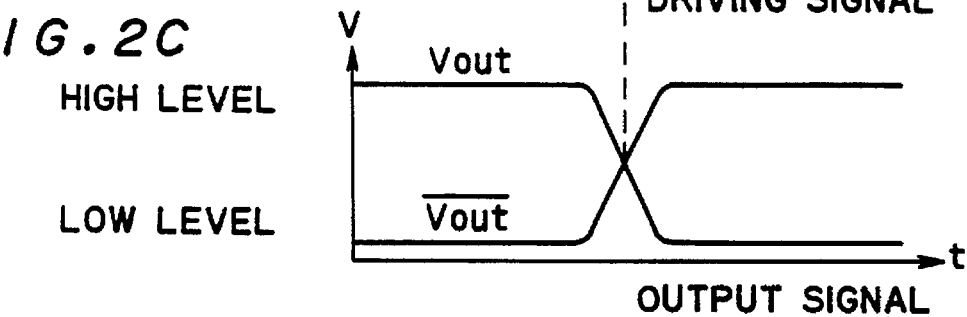
Figure 3:
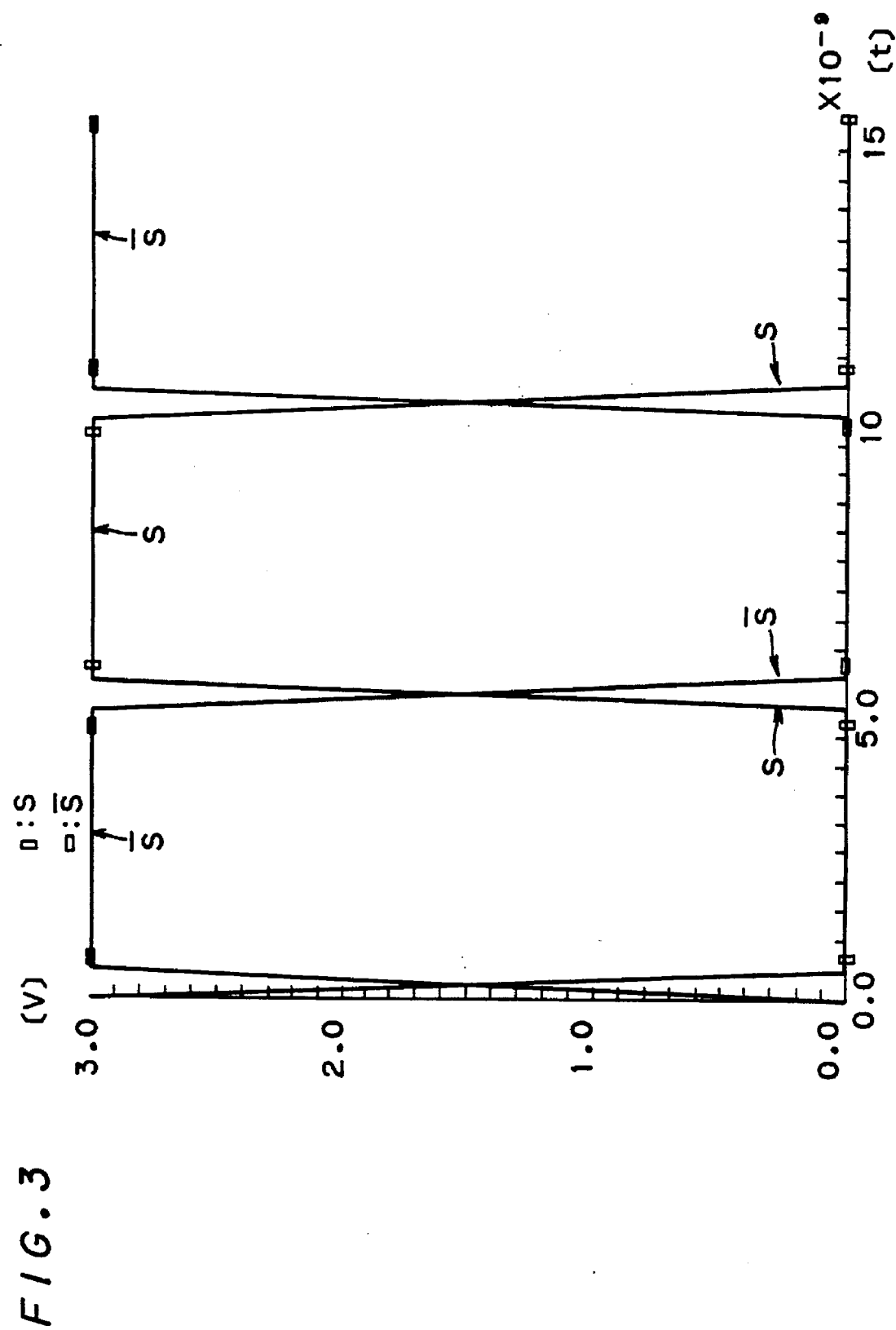
FIGS. 3 to 7 are graphs showing results of a circuit simulation.
Figure 4:
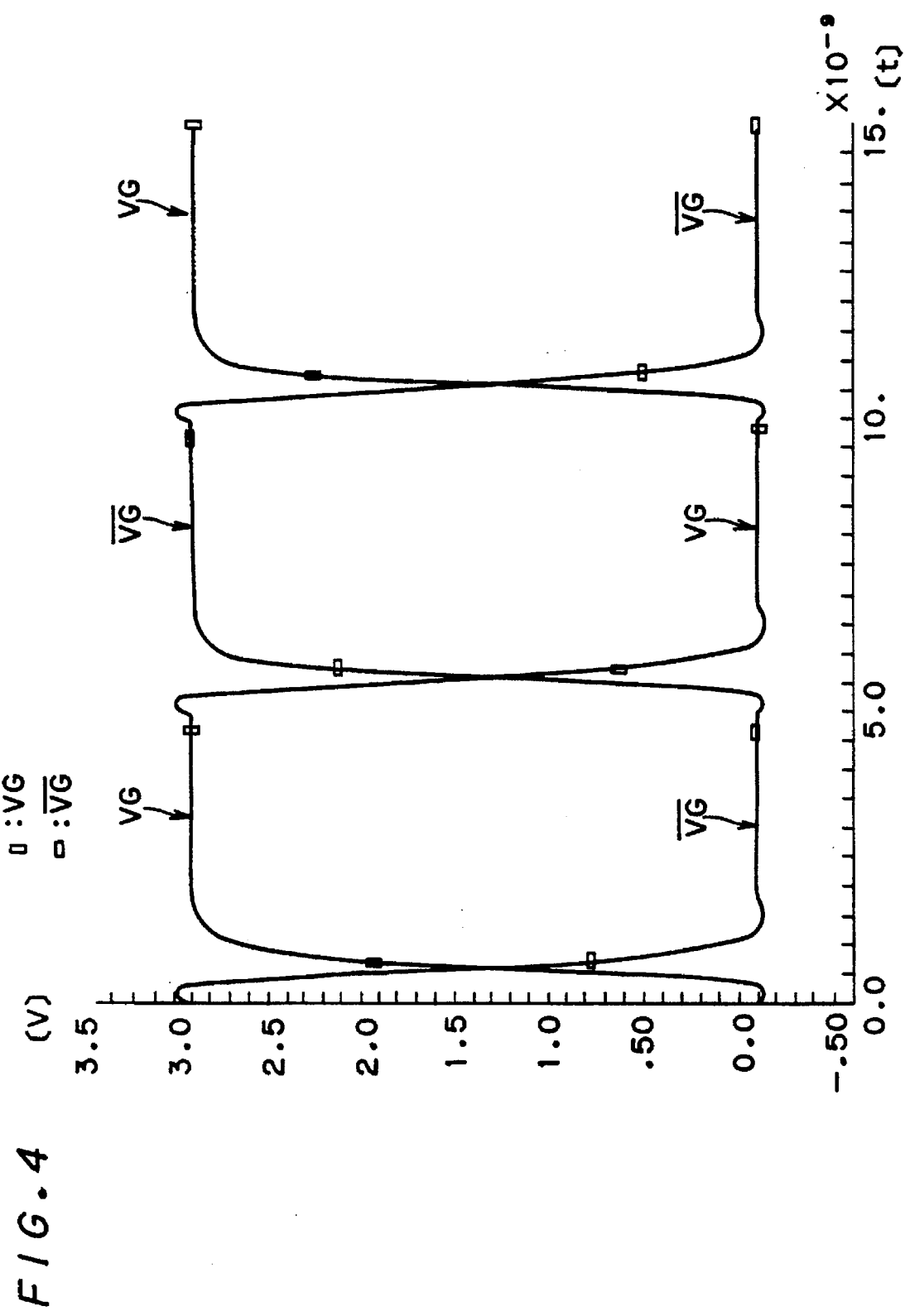
Figure 5:
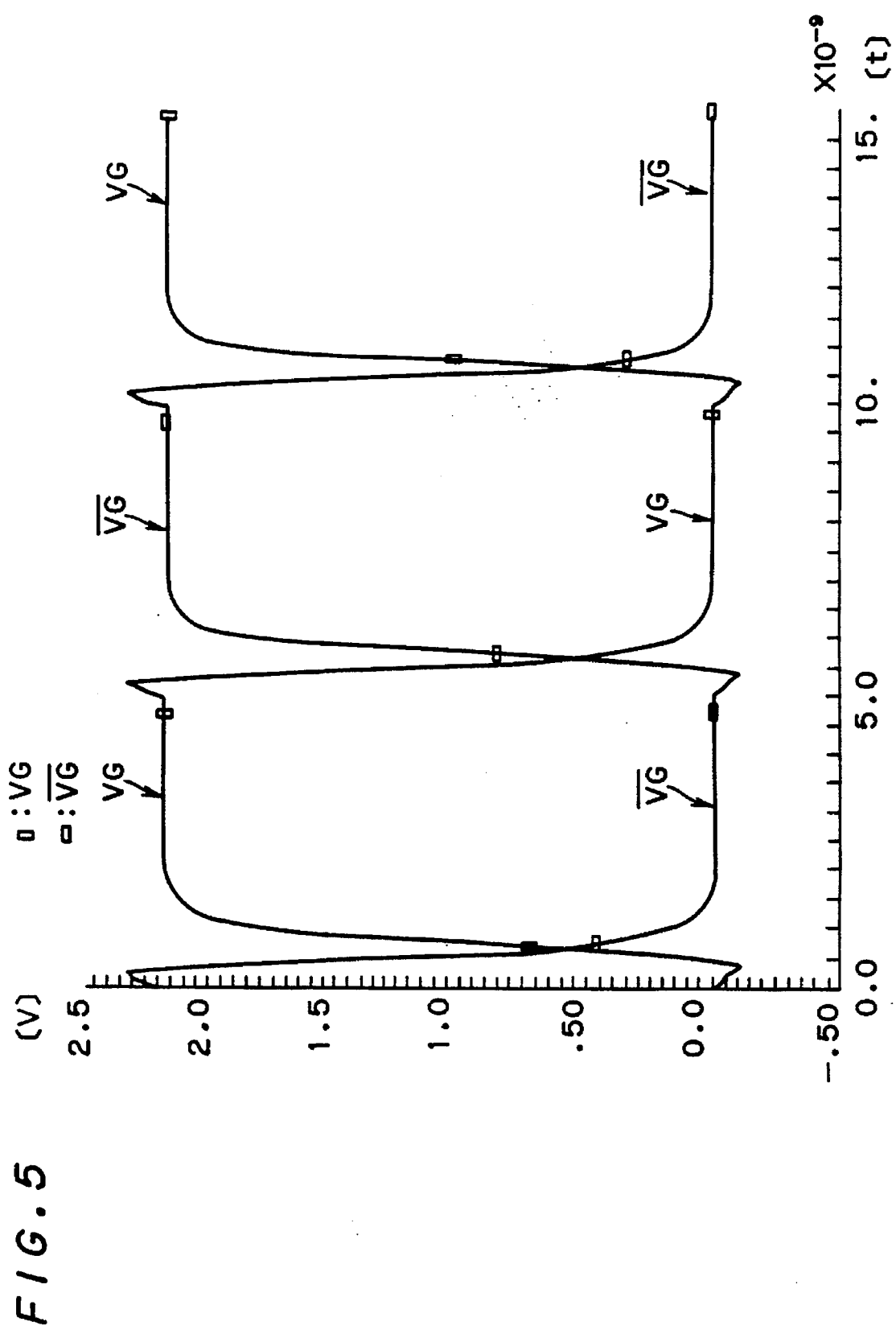
Figure 6:
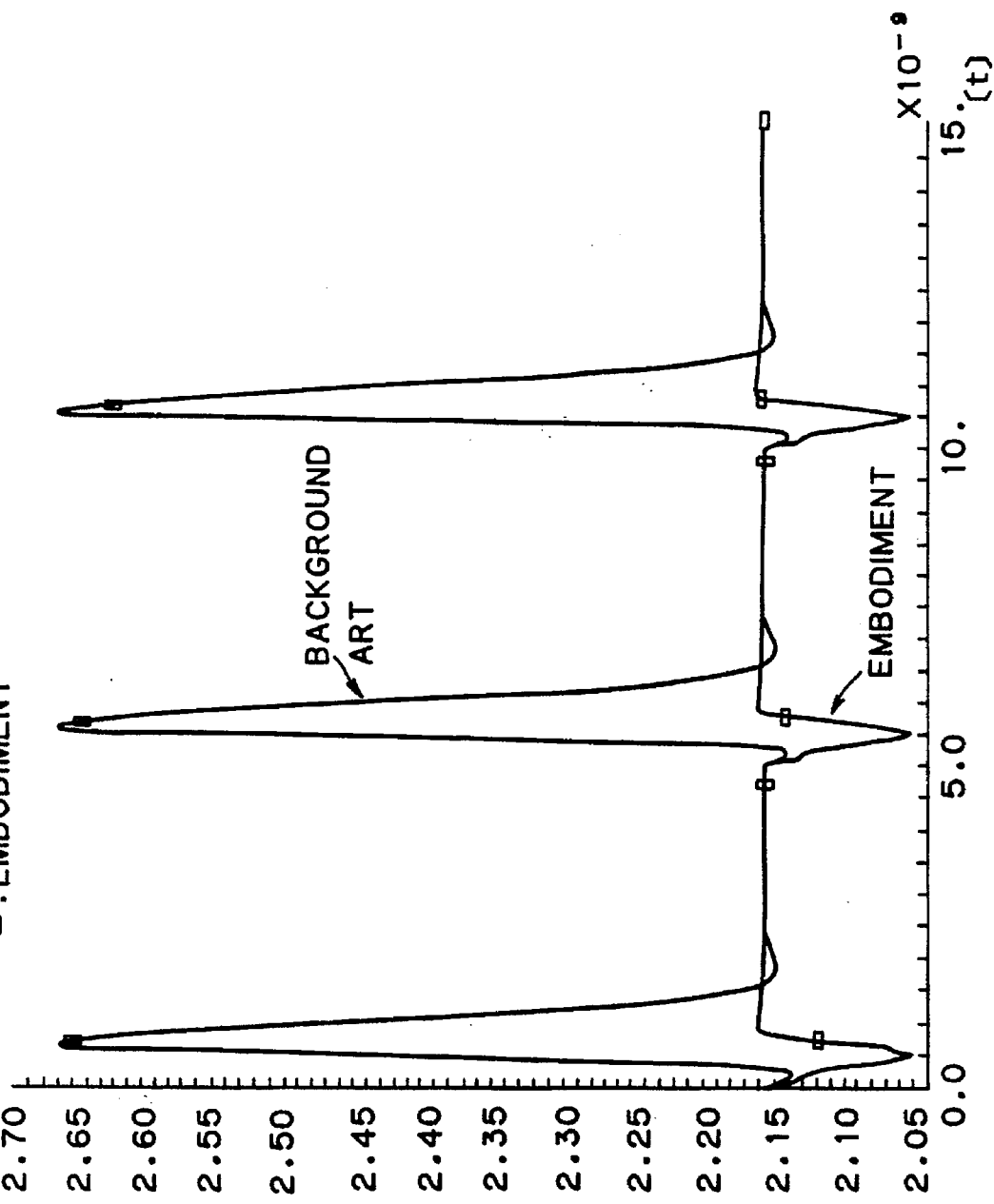
Figure 7:
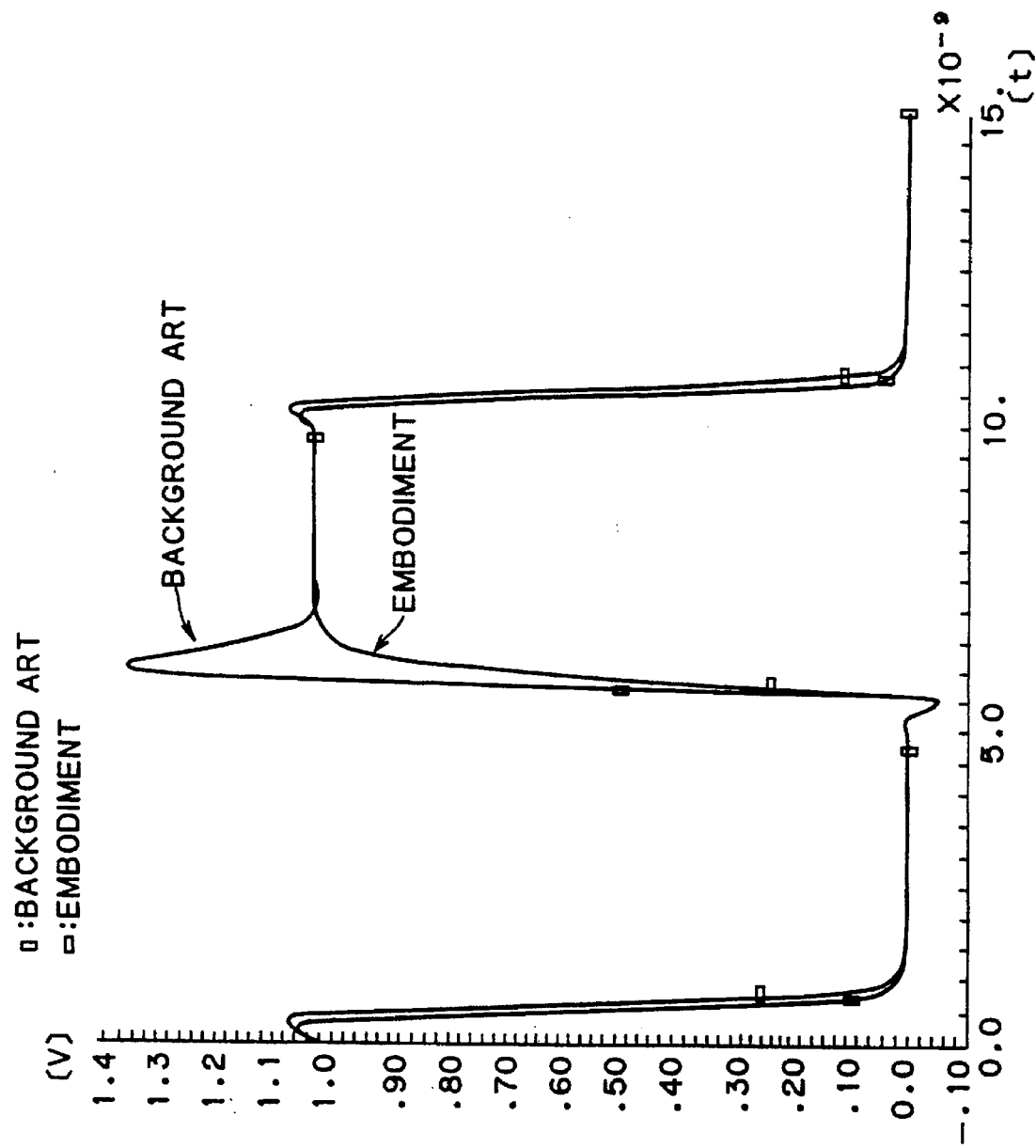

As can be seen from FIG. 2B, it is clear from the above discussion that the cross point of the driving signals $\overline{VG}$ and VG of the complementary current source circuit of FIG. 1 is lower as compared with the prior art. Accordingly, the switching transistors are not simultaneously turned on and off, in contrast to the prior art. In the first preferred embodiment, more specifically, one switching transistor (e.g., transistor Q15) turns on, and then the other switching transistor (e.g., transistor Q16) turns on while the transistor Q15 is in the ON state. After a while, one switching transistor (e.g., transistor Q15) turns off while the other switching transistor (e.g., transistor Q16) remains on. As the result, the fluctuation of the voltage $V_X$ at the internal node X due to the simultaneous switching decreases as compared with the prior art, thus suppressing generation of surplus current. As shown in FIG. 2C, there arises no overshoot and a short settling time can be achieved. Therefore, it becomes possible to provide the complementary current source circuit for a high-speed D/A converter. FIGS. 3 to 7 show results of a circuit simulation to verify the first preferred embodiment. The simulation is performed, assuming that the channel width/channel length (hereinafter referred to simply as "W/L") of the transistor Q17 is 100 μm/1 μm, the W/L of the transistors Q15 and Q16 is 50 μm/1 μm, the W/L of the transistors Q18 and Q20 is 15 μm/1 μm, the W/L of the transistors Q19 and Q21 is 5 μm/1 μm and the resistance value (the resistance element is not shown though connected) is 1 kΩ in FIG. 1. The simulation on the prior-art device is also performed, assuming that the W/L of the transistors Q4 and Q6 is 10 μm/1 μm. FIG. 3 is a graph showing the input signals $\overline{S}$ and S. FIGS. 4 and 5 are graphs showing the driving signals $\overline{VG}$ and VG of the driving circuits 2 in the prior art the driving circuits 6 in the first preferred embodiment, respectively. FIG. 6 is a graph showing the internal node voltages $V_X$ in the main current sources 1 and 5 in the prior art and the first preferred embodiment. FIG. 6 is a graph showing the output voltages $V_{out}$ in the prior art and the first preferred embodiment. FIG. 7 shows the output voltages $V_{out}$ in the prior art and the first preferred embodiment. As is clear from these figures, there arises no overshoot, which has taken place in the prior art, and an improvement in settling time can be accomplished.

<The Second Preferred Embodiment>

Figure 8:
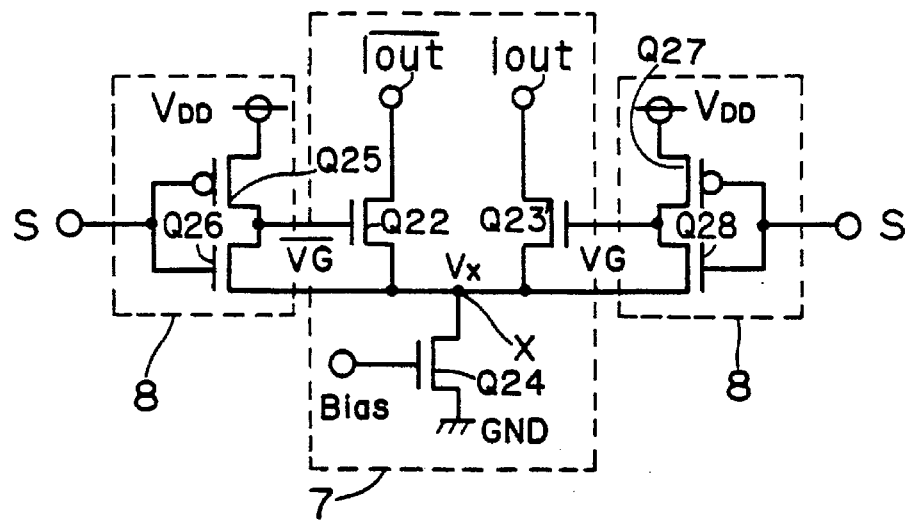
FIG. 8 is a circuit diagram of a complementary current source circuit used in the D/A converter, which has a main current source 7 consisting of NMOS transistors, in accordance with a second preferred embodiment of the present invention.
Figure 9A:
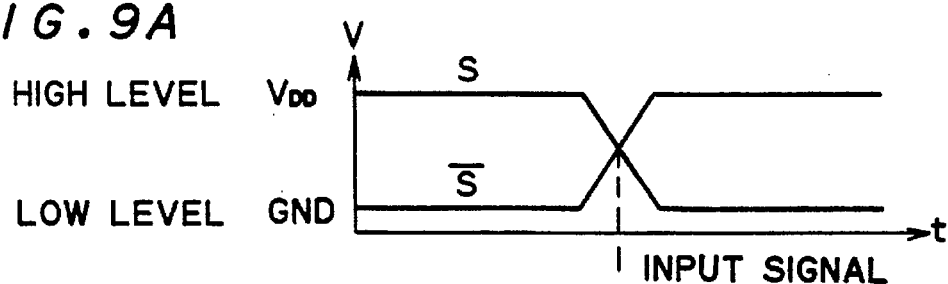
FIGS. 9A to 9C are charts showing signal waveforms in prime parts of the complementary current source circuit of FIG. 8.
Figure 9B:
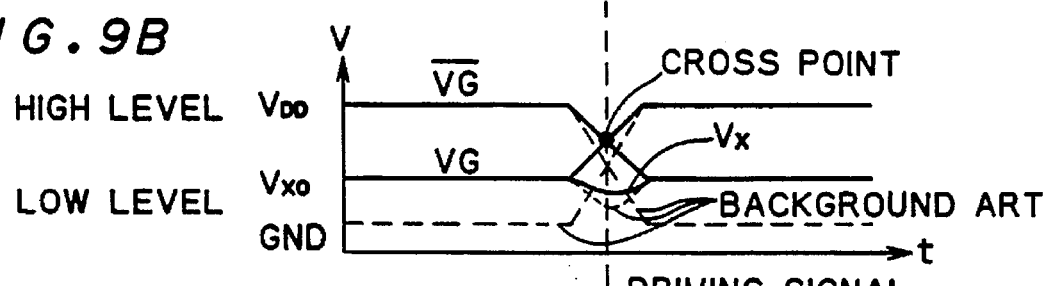
Figure 9C:
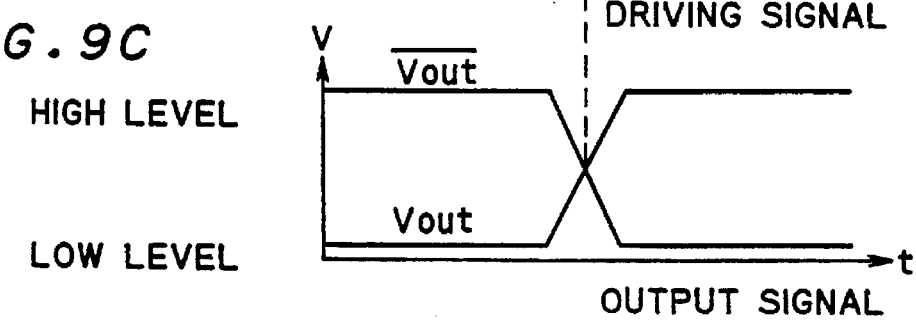

Now, referring to FIG. 8, the second preferred embodiment of the present invention will be discussed. FIG. 8 is a circuit diagram of a complementary current source circuit used in a D/A converter of the second preferred embodiment, having a main current source which consists of NMOS transistors. The complementary current source circuit of FIG. 8 essentially consists of a main current source 7 and driving circuits 8. FIGS. 9A to 9C are charts showing signal waveforms in prime parts of the complementary current source circuit of FIG. 8. In the second preferred embodiment, the source terminals of the NMOS transistors Q26 and Q28 are connected to the internal node X in the main current source 7, while the source terminals of the NMOS transistors Q5 and Q7 are connected to GND lines in the prior-art CMOS inverters. A circuit operation of the second preferred embodiment is the same as that of the first preferred embodiment. Respective behaviors of the transistors in the main current source 7 are logically as follows: It is needed that the transistor Q24 should be in a saturation region and the transistor Q23 should be biased to operate in the saturation region when it in an ON state. Specifically, the drain voltage $V_X$ of the transistor Q24 must be set sufficiently high so that the transistor Q24 may operate in the saturation region. The drain voltage $V_X$ depends on a gate voltage $V_G$ which is applied to turn on the transistor Q23. Therefore, assuming that reference characters $V_{sat}23$, $V_{sat}24$ and $V_{th}23$ represent a saturation voltage of the transistor Q23, a saturation voltage of the transistor Q24 and a threshold value of the transistor Q23 respectively, from the general expression which holds at a saturation boundary point "$V_{GS}-V_{TH}=V_{DS}$", the equation "$(V_G-V_X)-V_{th}=V_{sat}23$" holds with respect to the transistor Q23, leading to the equation "$V_X=V_G-V_{sat}23-V_{th}23$". Since the drain voltage $V_X$ of the transistor Q24 must be set sufficiently higher than "$V_{sat}24$" so that the transistor Q24 may operate in the saturation region, it should satisfy "$V_X=V_G-V_{sat}23-V_{th}23>V_{sat}24$". For example, assuming that the saturation voltages $V_{sat}23$ and $V_{sat}24$ are each 0.8 V, when the threshold value $V_{th}23$ is about 1.3 V under the body effect, the voltage $V_X$ is about 0.9 V where the gate voltage $V_G=3$ V.

FIG. 9A shows the waveforms of the input signals $\overline{S}$ and S inputted to the driving circuits 8. The input signals $\overline{S}$ and S are generated by decoding the digital signal inputted to the D/A converter. FIG. 9B shows the waveforms of the driving signals $\overline{VG}$ and VG outputted from the driving circuits 8, and also shows the waveforms of the prior-art driving signals $\overline{VG}$ and VG. As can be seen from FIG. 9B, the cross point of the driving signals $\overline{VG}$ and VG of the complementary current source circuit of FIG. 8 is higher as compared with the prior art, and the switching transistors are not simultaneously turned on and off, in contrast to the prior art. As the result, the fluctuation of the voltage $V_X$ at the internal node X due to the simultaneous switching decreases as compared with the prior art, thus suppressing generation of surplus current. As shown in FIG. 9C, there arises no overshoot and a short settling time can be achieved. Therefore, it becomes possible to provide the complementary current source circuit for a high-speed D/A converter.

<The Third Preferred Embodiment>

Figure 10:
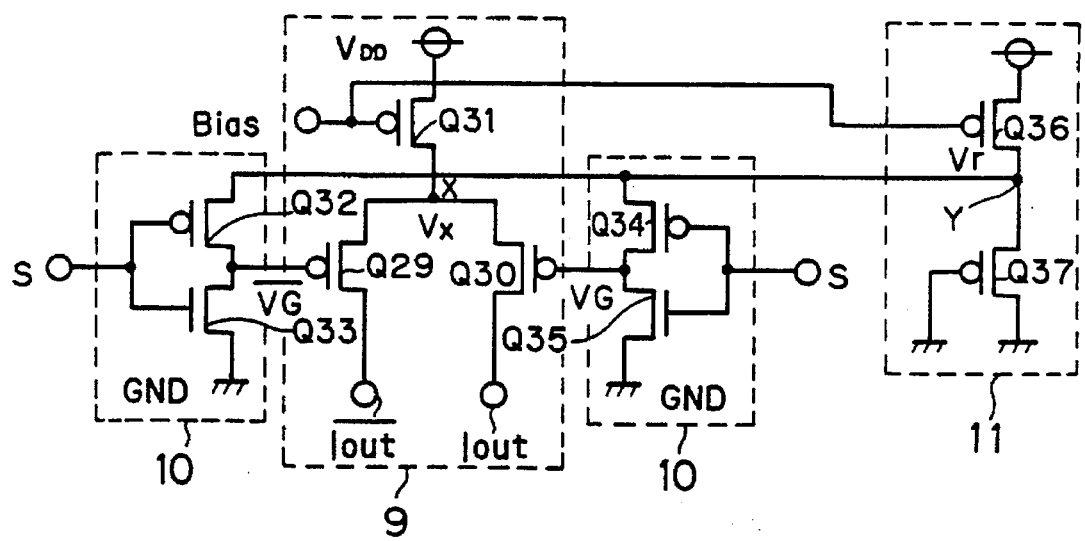
FIG. 10 is a circuit diagram of a complementary current source circuit used in the D/A converter in accordance with a third preferred embodiment of the present invention.
Figure 11A:
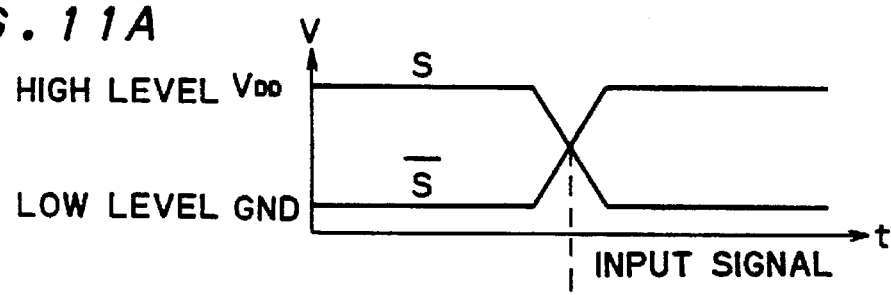
FIGS. 11A to 11C are charts showing signal waveforms in prime parts of the complementary current source circuit of FIG. 10.
Figure 11B:
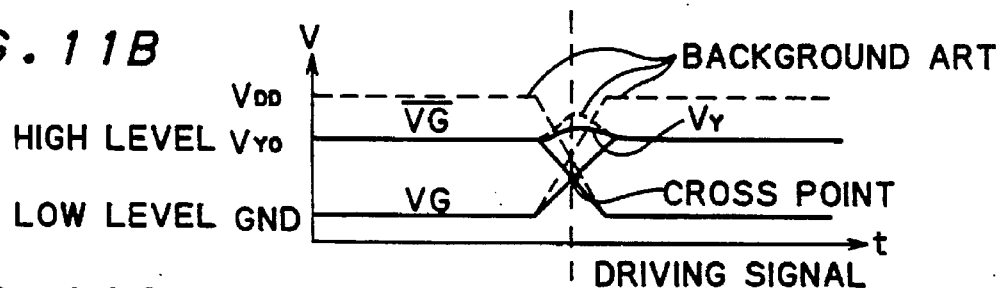
Figure 11C:
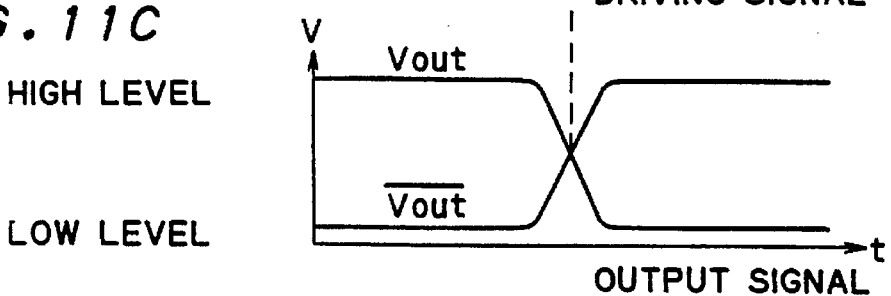

Now, referring to FIG. 10, the third preferred embodiment of the present invention will be discussed. FIG. 10 is a circuit diagram of a complementary current source circuit used in a D/A converter of the third preferred embodiment, having a main current source which consists of PMOS transistors. The complementary current source circuit of FIG. 10 essentially consists of a main current source 9, driving circuits 10 and a power supply circuit 11 serving as a voltage generator circuit. FIGS. 11A to 11C are charts showing signal waveforms in prime parts of the complementary current source circuit of FIG. 10. In the third preferred embodiment as shown in FIG. 10, the source terminals of the PMOS transistors Q32 and Q34 are connected to an output node Y in the power supply circuit 11 consisting of the transistors Q36 and Q37, while the source terminals of the PMOS transistors Q18 and Q20 in the driving circuits 6 are connected to the internal node X in FIG. 1. The transistors Q36 and Q37 are equivalent in size and characteristics to the transistors Q17 and Q16, respectively. The transistors Q17 and Q16 of FIG. 1 corresponds to the transistors Q31 and Q30 of FIG. 10, respectively. A bias voltage is applied to the gate terminal of the transistor Q36 so that the transistor Q36 may always operate in a saturation region. The gate terminal of the transistor Q37 is grounded. Additional provision of the power supply circuit 11 produces a new effect below, as well as the effect of the first preferred embodiment. In the first preferred embodiment, since the source terminals of the transistors Q18 and Q20 in the driving circuits 6 are connected to the internal node X in the main current source 5, part of the current of the main current source 5 leaks out to the inverter circuits of the driving circuits 6 due to an instantaneous current of the inverter circuits, which raises the possibility of current difference in the complementary current source circuit. There may arise a variation of the values of the output signals $\overline{V_{out}}$ and $V_{out}$ due to the current difference.

In the third preferred embodiment, providing the power supply circuit 11 separate from the main current source 9 avoids the possibility of the current difference due to the current leakage. The current of the main current source 9 flows into the transistors Q29 and Q30.

Figure 14:
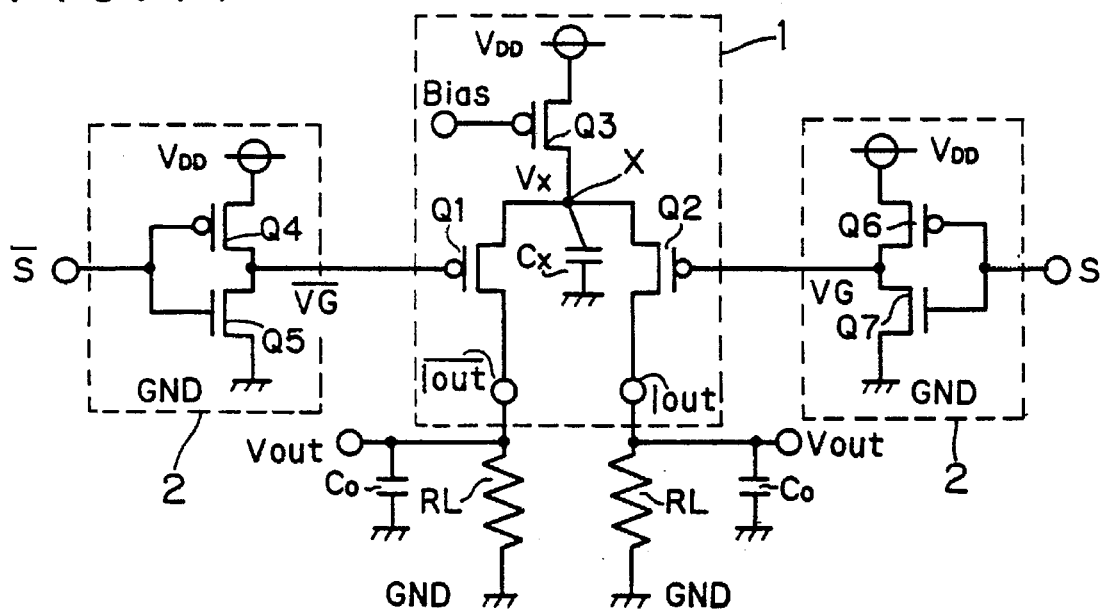
FIG. 14 is a circuit diagram showing a circuit configuration of a complementary current source circuit used in a D/A converter of the prior art.
Figure 15:
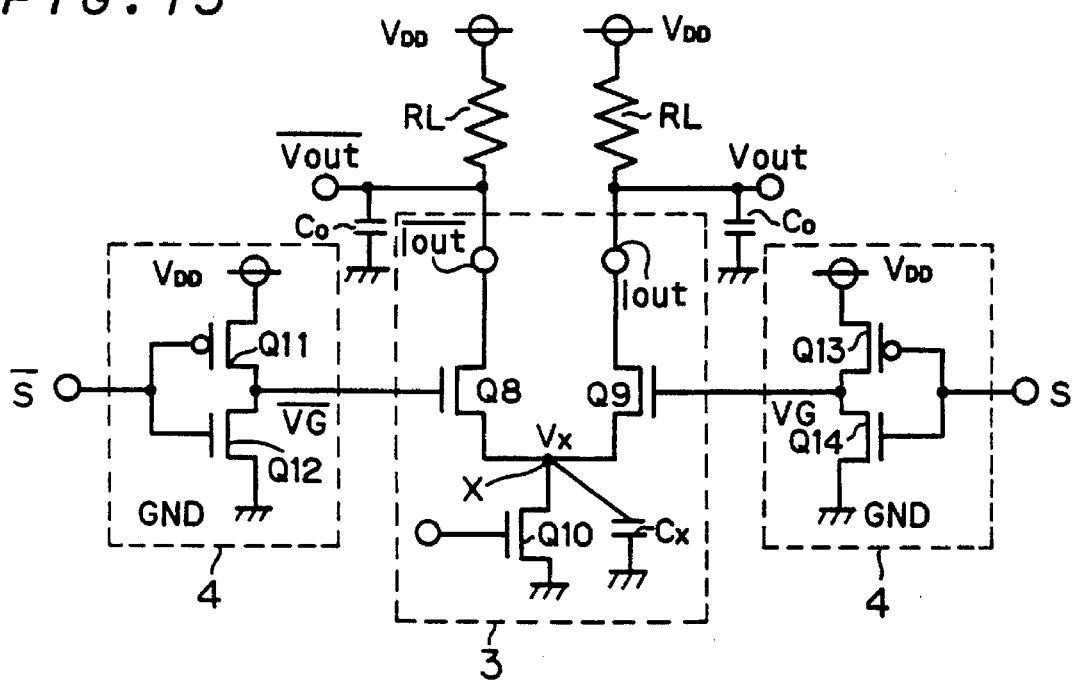
FIG. 15 is a circuit diagram showing a circuit configuration of a complementary current source circuit used in a D/A converter of the prior art.
Figure 16A:
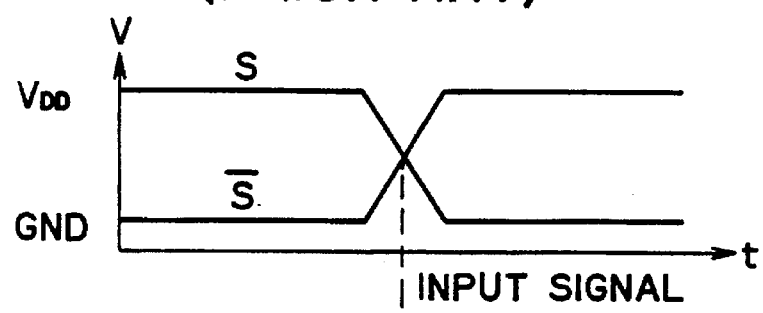
FIGS. 16A to 16C are charts showing signal waveforms of the complementary current source circuit of FIG. 14.
Figure 16B:
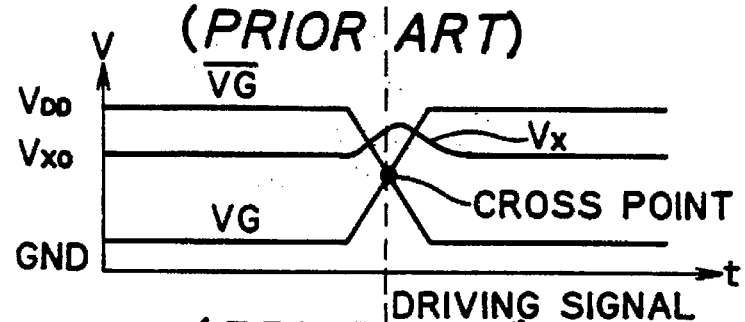
Figure 16C:
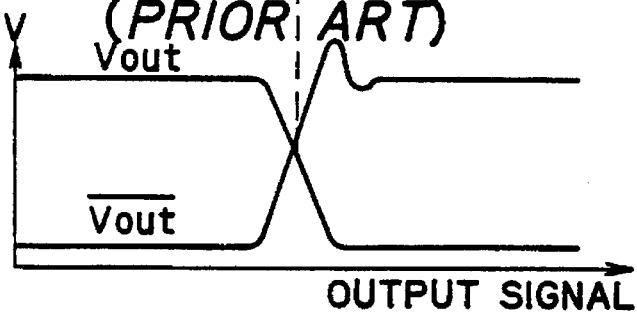
Figure 17A:
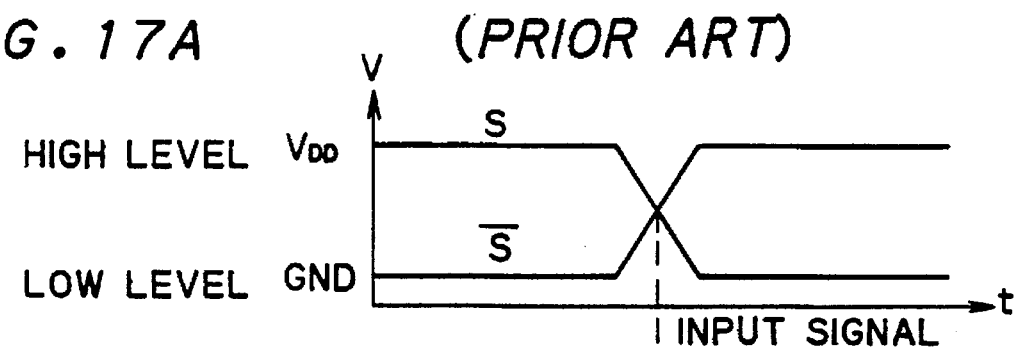
FIGS. 17A to 17C are charts showing signal waveforms of the complementary current source circuit of FIG. 15.
Figure 17B:
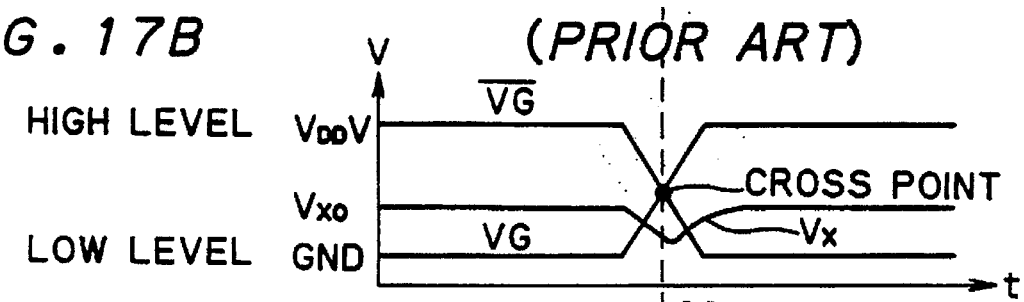
Figure 17C:
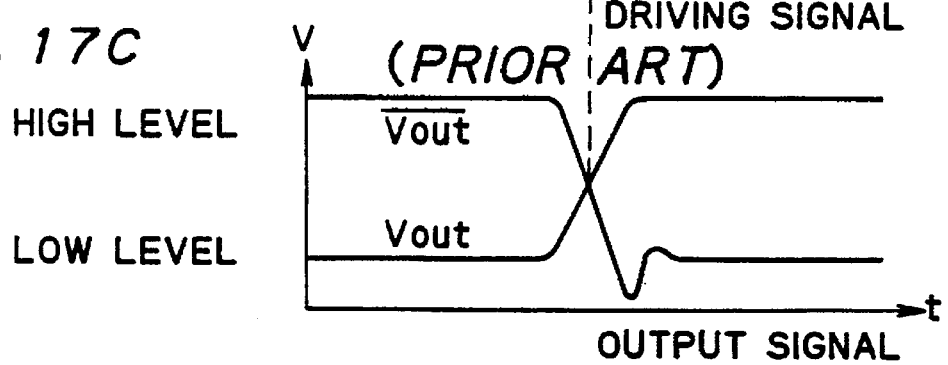

Furthermore, FIG. 10 shows a simplest configuration of the power supply circuit to provide the same voltage as that of the internal node X of FIG. 1. In FIG. 10, the external resistance load RL and floating capacitances $C_X$ and $C_O$ shown in FIG. 14 associated with the prior art are omitted.

An operation of the circuits as shown in FIG. 10 will be discussed. Since the ground voltage (GND-level voltage) is always applied to the gate terminal of the transistor Q37 which is a constituent of the power supply circuit 11, the transistor Q37 is always in the saturation region. The discussion of this circuit operation can be presented in the same way as the first preferred embodiment. If the transistors Q37 and Q36 have the same characteristics as the transistors Q16 and Q17, an output voltage $V_Y$ is expressed as "$V_Y=-V_{sat}16-V_{th}16$". The voltage at the internal node X is the same as that of the first preferred embodiment, i.e., "$V_X=V_G-V_{sat}16-V_{th}16<V_{DD}+V_{sat}17$". The driving signals $\overline{VG}$ and VG outputted from the driving circuits 10 are shown in FIG. 11B, and as is clear from this figure, the cross point of these signals becomes lower as compared with the prior art. For example, assuming that the saturation voltages $V_{sat}16$ and $V_{sat}17$ are each −0.8 V and the threshold value $V_{th}16$ is about −1.3 V under the body effect, the voltage $V_X$ is about 2.1 V and the voltage $V_Y$ is about 2.1 V where the gate voltage $V_G=0$ V.

Thus, in the third preferred embodiment, providing the separate power supply circuit 11 prevents the current leakage from the main current source 9 caused by the inverter circuits constituting the driving circuits 10, thereby avoiding the possibility of variation of the output signals $\overline{V_{out}}$ and $V_{out}$.

<The Fourth Preferred Embodiment>

Figure 12:
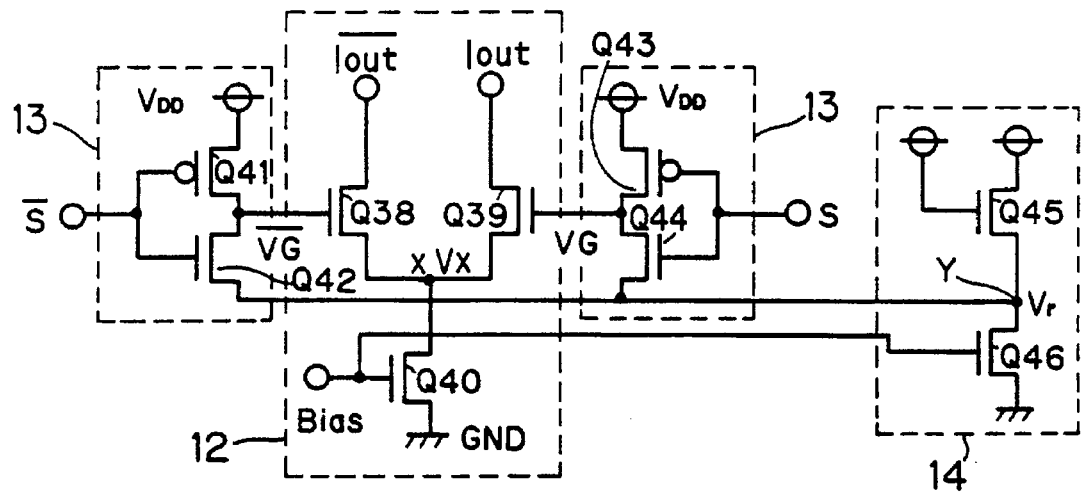
FIG. 12 is a circuit diagram of a complementary current source circuit used in the D/A converter in accordance with a fourth preferred embodiment of the present invention.
Figure 13A:
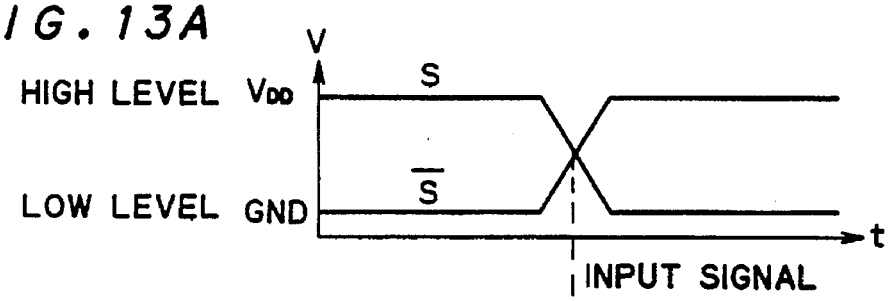
FIGS. 13A to 13C are charts showing signal waveforms in prime parts of the complementary current source circuit of FIG. 12.
Figure 13B:
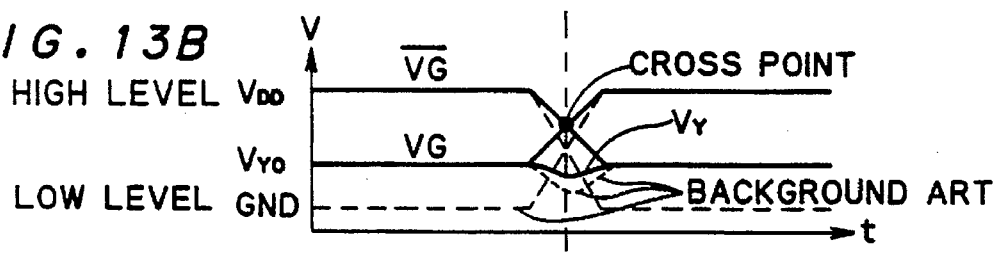
Figure 13C:
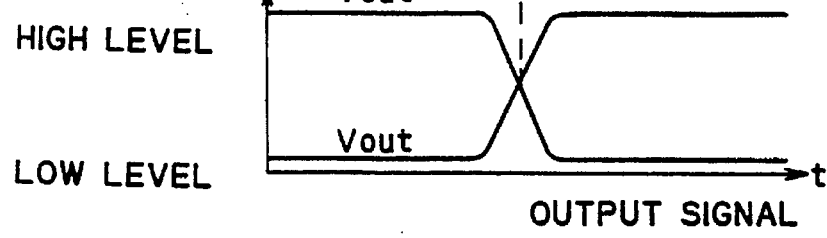

Now, referring to FIG. 12, the fourth preferred embodiment of the present invention will be discussed. FIG. 12 is a circuit diagram of a complementary current source circuit used in a D/A converter of the fourth preferred embodiment, having a main current source which consists of NMOS transistors. The complementary current source circuit of FIG. 12 essentially consists of a main current source 12, driving circuits 13 and a power supply circuit 14 serving as a voltage generator circuit. FIGS. 13A to 13C are charts showing signal waveforms in prime parts of the complementary current source circuit of FIG. 12. In the fourth preferred embodiment as shown in FIG. 12, the source terminals of the NMOS transistors Q42 and Q44 are connected to the output node Y in the power supply circuit 14 consisting of the transistors Q45 and Q46, while the source terminals of the NMOS transistors Q26 and Q28 in the driving circuits 8 are connected to the internal node X in FIG. 8. The transistors Q45 and Q46 are equivalent in size and characteristics to the transistors Q23 and Q24, respectively. The transistors Q23 and Q24 of FIG. 8 corresponds to the transistors Q39 and Q40 of FIG. 12, respectively. Additional provision of the power supply circuit 14 produces the same effect as the third preferred embodiment to avoid the possibility of current difference due to the instantaneous current. Like in the third preferred embodiment, since the power supply-level voltage ($V_{DD}$) is always applied to the gate terminal of the transistor Q45 which is a constituent of the power supply circuit 14 of FIG. 12, the transistor Q45 is always in a saturation region. The discussion of this circuit operation can be presented in the same way as the second preferred embodiment. If the transistors Q45 and Q46 in the power supply circuit 14 have the same characteristics as the transistors Q23 and Q24, the output voltage $V_Y$ is expressed as "$V_Y = V_{DD} - V_{sat}23 - V_{th}23$". The voltage at the internal node X is the same as that of the second preferred embodiment, i.e., "$V_X = V_G - V_{sat}23 - V_{th} > V_{sat}24$". The driving signals $\overline{VG}$ and VG outputted from the driving circuits 13 are shown in FIG. 13B, and as is clear from this figure, the cross point of these signals becomes higher as compared with the prior art. For example, assuming that the saturation voltages $V_{sat}23$ and $V_{sat}24$ are each 0.8 V and the threshold value $V_{th}23$ is about 1.3 V under the body effect, the voltage $V_X$ is about 0.9 V and the voltage $V_Y$ is about 0.9 V where the gate voltage $V_G = 3$ V.

Thus, in the fourth preferred embodiment, providing the separate power supply circuit 14 prevents the current leakage from the main current source 12 caused by the inverter circuits constituting the driving circuits 13, thereby avoiding the possibility of variation of the output signals $\overline{V_{out}}$ and $V_{out}$.

In the first to fourth preferred embodiments as discussed above, the source terminals of the PMOS transistors or the NMOS transistors are connected to the internal node in the main current source or the output node in the power supply circuit which is separate from the main current source. In these cases, the following should be noted. For example, the transistors Q18 and Q20 of FIG. 1 are connected to the internal node X in the main current source 5, instead of the power supply in the prior art, and in other words, connected to the internal node voltage which is lower than the power supply voltage. This imposes a restriction on the operation speed and the transistors of the same size as the prior art operate slowly. Accordingly, the transistors Q18 and Q20 must become larger in size depending on the operation speed. As an example, the simulation result shown in FIGS. 3 to 7 indicates that a higher-speed operation as compared with the prior art can be achieved when the channel length L is enlarged merely from 10 μm of the prior art to 15 μm (especially see FIG. 7). It can be seen from FIG. 7 that, after $5.0 \times 10^{-9}$(t), while there is an effect of overshoot on the output voltage $V_{out}$ in the prior art, there is no rise of the output voltage $V_{out}$ in the preferred embodiment. Therefore, the D/A conversion just needs a shorter settling time as compared with the prior art.

Figure 18:
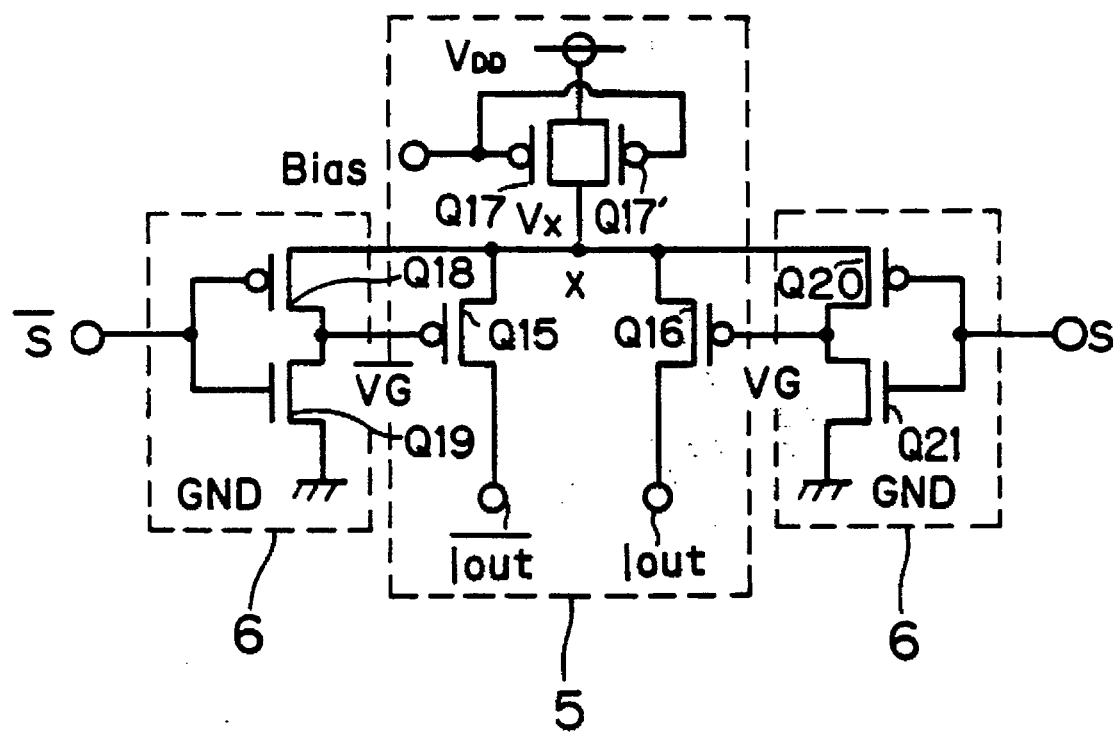
FIG. 18 is a circuit diagram showing another configuration of the complementary current source circuit used in the D/A converter, which has the main current source 5 consisting of PMOS transistors, in accordance with the first preferred embodiment of the present invention.

The D/A converter can be achieved by providing a plurality of the complementary current source circuits of the first to fourth preferred embodiments in accordance with the digital signal to be inputted and connecting a plurality of current output terminals of the main current sources of the complementary current source circuits to an analog output terminal. Furthermore, the main current sources 5, 7, 9 and 12 may be provided with a plurality of transistors to which the bias voltage is applied. For example, FIG. 18 shows a configuration where the main current source 5 is provided with a plurality of transistors to which the bias voltage is applied.

While the invention has been shown and described in detail, the foregoing description is in all aspects illustrative and not restrictive. It is therefore understood that numerous modifications and variations can be devised without departing from the scope of the invention.

We claim:

1. A complementary current source circuit, comprising:
   a current source comprising
      at least one first transistor of a first conductivity type, having a first current electrode connected to a first power supply, a second current electrode and a gate to which a constant bias voltage is applied,
      a first switching transistor having a first current electrode connected to said second current electrode of said first transistor and a second current electrode connected to a first current output terminal, controlled by a first driving signal which is generated in accordance with a first digital signal, and
      a second switching transistor having a first current electrode connected to said second current electrode of said first transistor and a second current electrode connected to a second current output terminal, controlled by a second driving signal which is generated in accordance with a second digital signal;
   a first driving circuit for generating said first driving signal to drive said first switching transistor; and
   a second driving circuit for generating said second driving signal to drive said second switching transistor,
   wherein
   a first potential as the high level of said first driving signal is lower than a potential of said first power supply if the first conductivity type is P type, and
   a second potential as the low level of said first driving signal is higher than a ground potential if the first conductivity type is N type, wherein
   said first driving circuit includes a first inverter circuit and said second driving circuit includes a second inverter circuit,
   said first inverter circuit comprises a second transistor of the first conductivity type, having a source connected to said second current electrode of said first transistor, a drain for outputting said first driving signal and a gate, and
   said second inverter circuit comprises a third transistor of the first conductivity type, having a source connected to said second current electrode of said first transistor, a drain for outputting said second driving signal and a gate.

2. The complementary current source circuit of claim 1, wherein
   a third potential as the high level of said second driving signal is equal to said first potential as the high level of said first driving signal, and
   a fourth potential as the low level of said second driving signal is equal to said second potential as the low level of said first driving signal.

3. The complementary current source circuit of claim 1, wherein
   said at least one first transistor includes a plurality of first transistors, and each of said plurality of first transistors having a first current electrode connected to said first power supply, a second current electrode connected to said first current electrodes of said first and second switching transistors and a gate to which said constant bias voltage is applied.

4. The complementary current source circuit of claim 1, wherein
   said first inverter circuit further comprises a fourth transistor having a drain connected to said drain of said second transistor, a source to which said ground potential is applied and a gate connected to said gate of said second transistor, and
   said second inverter circuit further comprises the fifth transistor having a drain connected to said drain of said third transistor, a source to which said ground potential is applied and a gate connected to said gate of said third transistor.

5. A complementary current source circuit, comprising:
   a current source comprising
      at least one first transistor of a first conductivity type, having a first current electrode connected to a first power supply, a second current electrode and a gate to which a constant bias voltage is applied,
      a first switching transistor having a first current electrode connected to said second current electrode of said first transistor and a second current electrode connected to a first current output terminal, controlled by a first driving signal which is generated in accordance with a first digital signal, and
      a second switching transistor having a first current electrode connected to said second current electrode of said first transistor and a second current electrode connected to a second current output terminal, controlled by a second driving signal which is generated in accordance with a second digital signal;
   a first driving circuit for generating said first driving signal to drive said first switching transistor; and
   a second driving circuit for generating said second driving signal to drive said second switching transistor, wherein
   a first potential as the high level of said first driving signal is lower than a potential of said first power supply if the first conductivity type is P type, and
   a second potential as the low level of said first driving signal is higher than a ground potential if the first conductivity type is N type,
   said complementary current source circuit further comprising:
   a voltage generator circuit comprising
      a second transistor of the first conductivity type of the same characteristics as said first transistor, having a first current electrode connected to said first power supply, a second current electrode and a gate to which said constant bias voltage is applied, and
      a third transistor of the first conductivity type, having a first current electrode connected to said second current electrode of said second transistor, a second current electrode connected to a second power supply and a gate connected to said second power supply so that said third transistor may be always conducted; wherein
   said first driving circuit includes a first inverter circuit and said second driving circuit includes a second inverter circuit,
   said first inverter circuit comprises a fourth transistor of the first conductivity type, having a source connected to said second current electrode of said second transistor, a drain for outputting said first driving signal and a gate, and
   said second inverter circuit comprises a fifth transistor of the first conductivity type, having a source connected to said second current electrode of said second transistor, a drain for outputting said second driving signal and a gate.

6. The complementary current source circuit of claim 5, wherein
   said first inverter circuit further comprises a sixth transistor having a drain connected to said drain of said fourth transistor, a source to which said ground potential is applied and a gate connected to said gate of said fourth transistor, and
   said second inverter circuit further comprises a seventh transistor having a drain connected to said drain of said fifth transistor, a source to which said ground potential is applied and a gate connected to said gate of said fifth transistor.

* * * * *